(12) United States Patent
Yang

(10) Patent No.: US 11,042,069 B2
(45) Date of Patent: Jun. 22, 2021

(54) ARRAY SUBSTRATE, DISPLAY PANEL, AND DISPLAY DEVICE

(71) Applicants: Chongqing HKC Optoelectronics Technology Co., Ltd., Chongqing (CN); HKC Corporation Limited, Guangdong (CN)

(72) Inventor: Yanna Yang, Chongqing (CN)

(73) Assignees: Chongqing HKC Optoelectronics Technology Co., Ltd., Chongqing (CN); HKC Corporation Limited, Shenzhen (CN)

( * ) Notice: Subject to any disclaimer, the term of this patent is extended or adjusted under 35 U.S.C. 154(b) by 43 days.

(21) Appl. No.: 16/241,941

(22) Filed: Jan. 7, 2019

(65) Prior Publication Data

US 2020/0073186 A1  Mar. 5, 2020

Related U.S. Application Data

(63) Continuation of application No. PCT/CN2018/111826, filed on Oct. 25, 2018.

(30) Foreign Application Priority Data

Sep. 3, 2018 (CN) .......................... 201811028670.9

(51) Int. Cl.
*G02F 1/1362* (2006.01)
*H01L 27/12* (2006.01)
(Continued)

(52) U.S. Cl.
CPC ...... *G02F 1/136286* (2013.01); *G02F 1/1368* (2013.01); *G02F 1/134309* (2013.01);
(Continued)

(58) Field of Classification Search
CPC ......... G02F 1/136286; G02F 1/134309; G02F 1/1368; G02F 2201/121; G02F 2201/123; G02F 1/136222; H01L 27/124
(Continued)

(56) References Cited

U.S. PATENT DOCUMENTS

2015/0001541 A1    1/2015  Shin et al.
2016/0026046 A1*   1/2016  Itoh ................... G02F 1/136286
                                                  257/43
(Continued)

FOREIGN PATENT DOCUMENTS

CN    101604087 A    12/2009
CN    103543563 A    1/2014
(Continued)

OTHER PUBLICATIONS

1st Office Action of counterpart Chinese Patent Application No. 201811028670.9 dated Apr. 20, 2020.

*Primary Examiner* — Charles S Chang

(57) ABSTRACT

The present disclosure provides an array substrate, a display panel, and a display device. The array substrate includes a base plate, the sub zone common electrode, the compensation electrode, and the sub zone pixel electrode are formed on the base plate in sequence, the projection area of the compensation electrode on the base plate is spaced from the projection area of the sub zone pixel electrode on the base plate.

17 Claims, 3 Drawing Sheets

(51) Int. Cl.
 *G02F 1/1343* (2006.01)
 *G02F 1/1368* (2006.01)
(52) U.S. Cl.
 CPC ...... *H01L 27/124* (2013.01); *G02F 1/136222* (2021.01); *G02F 2201/121* (2013.01); *G02F 2201/123* (2013.01)
(58) Field of Classification Search
 USPC ..................................................... 349/38–39
 See application file for complete search history.

(56) References Cited

U.S. PATENT DOCUMENTS

| | | | |
|---|---|---|---|
| 2016/0139470 A1 | 5/2016 | Sato | |
| 2017/0003554 A1* | 1/2017 | Kim | ................. G02F 1/134336 |
| 2017/0023833 A1* | 1/2017 | No | .................... G02F 1/134309 |
| 2017/0184928 A1 | 6/2017 | Tsai et al. | |
| 2017/0285427 A1* | 10/2017 | Kim | ................. G02F 1/136213 |

FOREIGN PATENT DOCUMENTS

| | | | |
|---|---|---|---|
| CN | 104460160 | A | 3/2015 |
| CN | 20459398 | U | 8/2015 |
| CN | 106647055 | A | 5/2017 |
| CN | 106773394 | A | 5/2017 |
| CN | 206258650 | U | 6/2017 |
| CN | 107179636 | A | 9/2017 |
| CN | 107608104 | A | 1/2018 |
| JP | 2007025487 | A | 2/2007 |
| JP | 2008020613 | A | 1/2008 |

\* cited by examiner

ARRAY SUBSTRATE, DISPLAY PANEL, AND DISPLAY DEVICE

CROSS REFERENCE TO RELATED APPLICATIONS

The present application is a Continuation Application of PCT Application No. PCT/CN2018/111826 filed on Oct. 25, 2018, which claims the benefit of Chinese Patent Application No. 201811028670.9 filed on Sep. 3, 2018. All the above are hereby incorporated by reference.

FIELD

The disclosure generally relates to the technical field of display, and more particularly relates to an array substrate, a display panel, and a display device.

BACKGROUND

Currently, a multi-domain technology is normally adopted to divide one sub pixel into a plurality of regions, enabling the liquid crystals in each of the regions to rotate to different directions when being applied with voltage, therefore the display effects observed from every directions tend towards average and uniform, as such the view angle of the liquid crystal display is enlarged. In order to improve the visual color difference or visual color shift, the current technology would divide one sub pixel into a main zone and a sub zone, an independent main zone pixel electrode is defined in the main zone, and an independent sub zone pixel electrode is defined in the sub zone, the main zone pixel electrode and the sub zone pixel electrode are both a slit electrode with a shape like " ✱ ", to form eight domains to display. Two many thin film transistors (TFT) would cause the aperture ratio of the pixel decreasing, and a difference may generate between the voltage of the main zone and the voltage of the sub zone as adopting the charge sharing technology, the difference may further increase the difficulty of controlling the balance of the best common voltages (best $V_{com}$) of the main zone and the sub zone. With the increasing of the quantity of TFT and the multi-domain, much more space is occupied. In order to effectively utilize the design space, the distance between the wires are designed to be much smaller, which may cause the compensation electrode overlapping with the pixel electrode, then common electrode signals may be shielded, thus poor liquid crystal alignment would occur.

SUMMARY

It is therefore one main object of the present disclosure to provide an array substrate, which aims to improve the liquid crystal alignment.

To achieve the above aim, the array substrate provided by the present disclosure includes:

a base plate, a plurality of scan lines and a plurality of data lines all formed on the base plate, the plurality of scan lines insulate and cross with the plurality of data lines to define a plurality of sub-pixels;

each of the sub-pixels includes a main zone and a sub zone, the scan lines are defined between the main zone and the sub zone, the main zone includes a main zone pixel electrode and a main zone common electrode, the sub zone includes a sub zone pixel electrode, a sub zone common electrode, and a compensation electrode, the sub zone common electrode skips the scan lines to electrically connect the main zone common electrode; and the sub zone common electrode, the compensation electrode, and the sub zone pixel electrode are formed on the base plate in sequence, the compensation electrode insulates with the sub zone common electrode, and electrically connects with the sub zone pixel electrode through a through hole, a projection area of the compensation electrode on the base plate is not larger than a projection area of the sub zone common electrode on the base plate, the projection area of the sub zone common electrode on the base plate at least partially overlaps with a projection area of the sub zone pixel electrode on the base plate, the projection area of the compensation electrode on the base plate is spaced from the projection area of the sub zone pixel electrode on the base plate.

Electively, the sub zone common electrode includes a first common electrode parallel to the data lines and a second common electrode parallel to the scan lines, the first common electrode electrically connects to the second common electrode, the compensation electrode is defined on the second common electrode, and the projection area of the compensation electrode on the base plate is not larger than a projection area of the second common electrode on the base plate.

Electively, when the width of the compensation electrode along an extending direction of the data line gradually decreases, the width of the first common electrode along an extending direction of the scan line increases; or the width of the second common electrode along the extending direction of the data line increases, to balance common voltages of the main zone and the sub zone.

Electively, a change amount of an overlapping area of the compensation electrode and the sub zone common electrode is recorded as $\Delta S1$, the vertical distance between the compensation electrode and the sub zone common electrode is recorded as $D1$, a change amount of an overlapping area of the sub zone pixel electrode and the sub zone common electrode is recorded as $\Delta S2$, the vertical distance between the sub zone pixel electrode and the sub zone common electrode is recorded as $D2$, $\Delta S1/D1=\Delta S2/D2$.

Electively, the compensation electrode and the sub zone pixel electrode have the same voltage, the sub zone common electrode and the main zone common electrode have the same voltage, and the voltage of the main zone pixel electrode is greater than the voltage of the sub zone pixel electrode.

Electively, the array substrate further includes a first thin film transistor, a second thin film transistor, and a third thin film transistor spaced from each other and all defined on the scan line, gate electrodes of the first thin film transistor, the second thin film transistor, and the third thin film transistor all electrically connect to the scan line, source electrodes of the first thin film transistor, the second thin film transistor, and the third thin film transistor all electrically connect to the data line, drain electrodes of the first thin film transistor electrically connect to the main zone pixel electrode, drain electrodes of the second thin film transistor and the third thin film transistor all electrically connect to the compensation electrode.

Electively, the array substrate further includes a first insulating layer defined between the sub zone common electrode and the compensation electrode.

Electively, the array substrate further includes a second insulating layer defined between the compensation electrode and the sub zone pixel electrode, the first insulating layer stacks with the second insulating layer.

The present disclosure further provides a display panel, which includes: an array substrate, a color film substrate facing the array substrate, and a liquid crystal layer located between the array substrate and the color film substrate, the array substrate includes:

a base plate, a plurality of scan lines and a plurality of data lines all formed on the base plate, the plurality of scan lines insulate and cross with the plurality of data lines to define a plurality of sub-pixels;

each of the sub-pixels includes a main zone and a sub zone, the scan lines are defined between the main zone and the sub zone, the main zone includes a main zone pixel electrode and a main zone common electrode, the sub zone includes a sub zone pixel electrode, a sub zone common electrode, and a compensation electrode, the sub zone common electrode skips the scan lines to electrically connect the main zone common electrode; and the sub zone common electrode, the compensation electrode, and the sub zone pixel electrode are formed on the base plate in sequence, the compensation electrode insulates with the sub zone common electrode, and electrically connects with the sub zone pixel electrode through a through hole, a projection area of the compensation electrode on the base plate is not larger than a projection area of the sub zone common electrode on the base plate, the projection area of the sub zone common electrode on the base plate at least partially overlaps with a projection area of the sub zone pixel electrode on the base plate, the projection area of the compensation electrode on the base plate is spaced from the projection area of the sub zone pixel electrode on the base plate.

The present disclosure further provides a display device, which includes display device, the display device includes a display panel, which includes an array substrate, a color film substrate facing the array substrate, and a liquid crystal layer located between the array substrate and the color film substrate, the array substrate includes:

a base plate, a plurality of scan lines and a plurality of data lines all formed on the base plate, the plurality of scan lines insulate and cross with the plurality of data lines to define a plurality of sub-pixels;

each of the sub-pixels includes a main zone and a sub zone, the scan lines are defined between the main zone and the sub zone, the main zone includes a main zone pixel electrode and a main zone common electrode, the sub zone includes a sub zone pixel electrode, a sub zone common electrode, and a compensation electrode, the sub zone common electrode skips the scan lines to electrically connect the main zone common electrode; and the sub zone common electrode, the compensation electrode, and the sub zone pixel electrode are formed on the base plate in sequence, the compensation electrode insulates with the sub zone common electrode, and electrically connects with the sub zone pixel electrode through a through hole, a projection area of the compensation electrode on the base plate is not larger than a projection area of the sub zone common electrode on the base plate, the projection area of the sub zone common electrode on the base plate at least partially overlaps with a projection area of the sub zone pixel electrode on the base plate, the projection area of the compensation electrode on the base plate is spaced from the projection area of the sub zone pixel electrode on the base plate.

For the array substrate in the present disclosure, the sub zone common electrode, the compensation electrode, and the sub zone pixel electrode are formed on the base plate in sequence, the compensation electrode insulates with the sub zone common electrode, and electrically connects with the sub zone pixel electrode through a through hole, the projection area of the compensation electrode on the base plate is not larger than the projection area of the sub zone common electrode on the base plate, the projection area of the sub zone common electrode on the base plate at least partially overlaps with a projection area of the sub zone pixel electrode on the base plate, the projection area of the compensation electrode on the base plate spaces from the projection area of the sub zone pixel electrode on the base plate, thus the compensation electrode would not shield the sub zone common electrode, and the rotating of the liquid crystals would also not be affected, the alignment of liquid crystals is improved.

BRIEF DESCRIPTION OF THE DRAWINGS

To better illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some embodiments according to this disclosure, and that those having ordinary skill in the art will be able to obtain other drawings based on the arrangements shown in these drawings without making inventive efforts.

Labels illustration for drawings.

Figure 1:
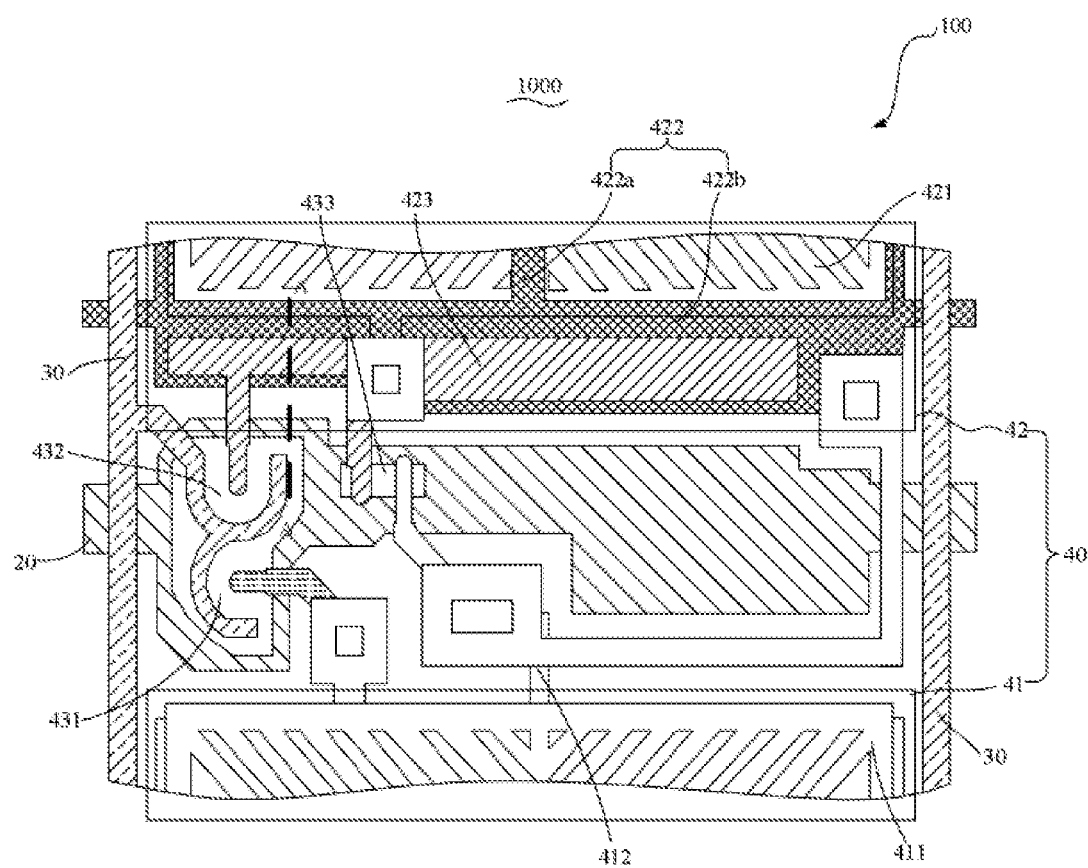
FIG. 1 is a plane structure diagram of the display panel of the present disclosure according to an exemplary embodiment.

| Label | Name | Label | Name |
|---|---|---|---|
| 100 | array substrate | 422a | first common electrode |
| 10 | base plate | 422b | second common electrode |
| 20 | scan line | 423 | compensation electrode |
| 30 | data line | 431 | first thin film transistor |
| 40 | sub-pixel | 432 | second thin film transistor |
| 41 | main zone | 433 | thin film transistor |
| 411 | main zone pixel electrode | 50 | first insulating layer |
| 412 | main zone common electrode | 60 | second insulating layer |
| 42 | sub zone | 200 | color film substrate |
| 421 | sub zone pixel electrode | 300 | liquid crystal layer |
| 422 | sub zone common electrode | 1000 | display panel |

The realization of the aim, functional characteristics, advantages of the present disclosure are further described specifically with reference to the accompanying drawings and embodiments.

DETAILED DESCRIPTION

The technical solutions of the embodiments of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present invention without creative efforts shall fall within the protection scope of the present invention.

It is to be understood that, all of the directional instructions in the exemplary embodiments of the present disclosure (such as top, down, left, right, front, back) can only be used for explaining relative position relations, moving condition of the elements under a special form (referring to figures), and so on, if the special form changes, the directional instructions changes accordingly.

In the present disclosure, unless specified or limited otherwise, the terms "connected," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In addition, the descriptions, such as the "first", the "second" in the present disclosure, can only be used for describing the aim of description, and cannot be understood as indicating or suggesting relative importance or impliedly indicating the number of the indicated technical character. Therefore, the character indicated by the "first", the "second" can express or impliedly include at least one character. In addition, the technical proposal of each exemplary embodiment can be combined with each other, however the technical proposal must base on that the ordinary skill in that art can realize the technical proposal, when the combination of the technical proposals occurs contradiction or cannot realize, it should consider that the combination of the technical proposals does not existed, and is not contained in the protection scope required by the present disclosure.

Figure 2:
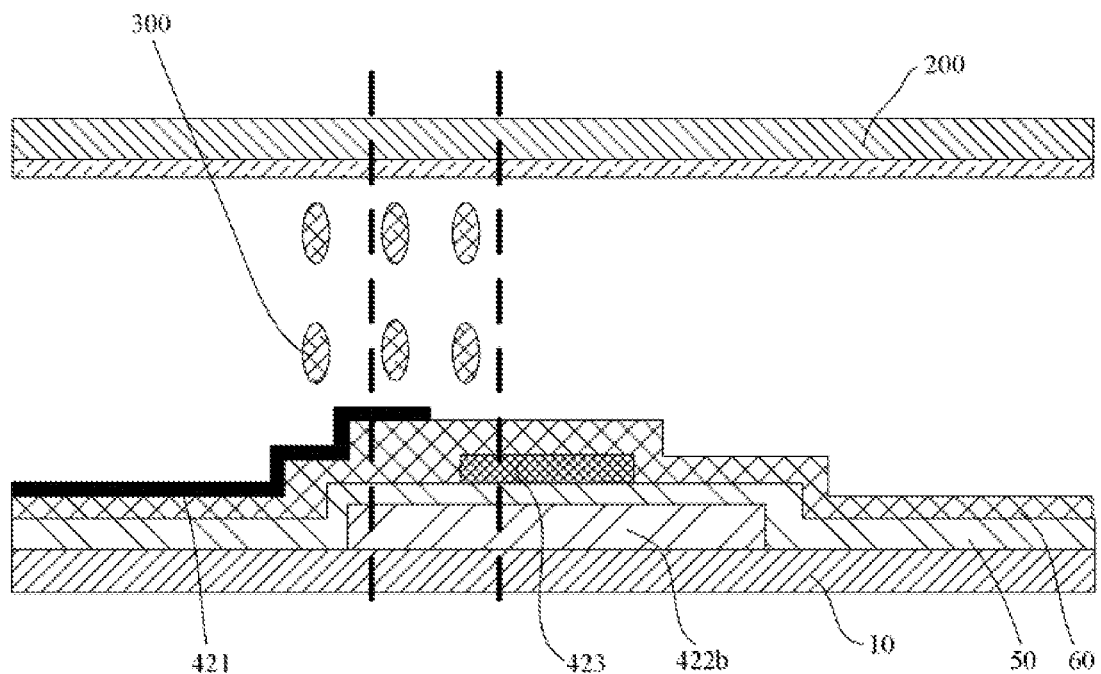
FIG. 2 is cross section diagram of a part of the display panel along line A-A shown in FIG. 1.
Figure 3:
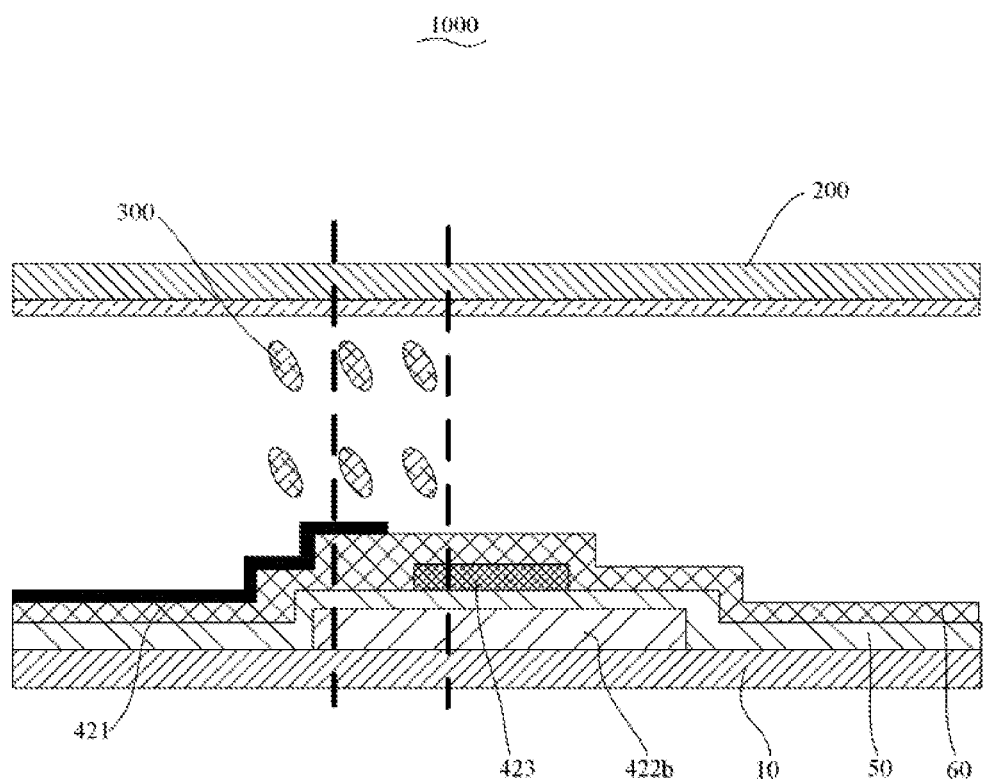
FIG. 3 is cross section diagram of a part of the display panel with voltage along line A-A shown in FIG. 1.

Referring to FIGS. 1-3, in the exemplary embodiment of the present disclosure, the array substrate 100 includes: a base plate 10, a plurality of scan lines 20 and a plurality of data lines 30 all formed on the base plate 10, the plurality of scan lines 20 insulate and cross with the plurality of data lines 30 to define a plurality of sub-pixels 40.

Each of the sub-pixels 40 includes a main zone 41 and a sub zone 42, the scan lines 20 are defined between the main zone 41 and the sub zone 42, the main zone 41 includes a main zone pixel electrode 411 and a main zone common electrode 412, the sub zone 32 includes a sub zone pixel electrode 421, a sub zone common electrode 422, and a compensation electrode 423, the sub zone common electrode 422 skips the scan lines 20 to electrically connect the main zone common electrode 412.

The sub zone common electrode 422, the compensation electrode 423, and the sub zone pixel electrode 421 are formed on the base plate 10 in sequence, the compensation electrode 423 insulates with the sub zone common electrode 422, and electrically connects with the sub zone pixel electrode 421 through a through hole, a projection area of the compensation electrode 423 on the base plate 10 is not larger than a projection area of the sub zone common electrode 422 on the base plate 10, the projection area of the sub zone common electrode 422 on the base plate 10 at least partially overlaps with a projection area of the sub zone pixel electrode 421 on the base plate 10, the projection area of the compensation electrode 423 on the base plate 10 spaces from the projection area of the sub zone pixel electrode 421 on the base plate 10.

In detail, the base plate 10 is a transparent substrate, such as, a glass substrate, or a quartz substrate, etc. The scan line 20 and the data line 30 are both made of conducting material, for example, aluminum alloy, or chromium metal, etc. The array substrate 100 includes a plurality of sub-pixels 40 arranged in matrix. The plurality of scan lines 20 insulate and cross with the plurality of data lines 30 to define the plurality of sub-pixels 40, the scan lines 20 are perpendicular to the data lines 30, and the plurality of scan lines 20 are parallel to each other and spaced from each other, the plurality of data lines 30 are parallel to each other and spaced from each other, two adjacent data lines 30 and two adjacent scan lines 20 cooperatively defines one sub-pixel 40.

The sub-pixel 40 includes a main zone 41 and a sub zone 42, the scan lines 20 are defined between the main zone 41 and the sub zone 42, the main zone 41 includes a main zone pixel electrode 411 and a main zone common electrode 412, the sub zone 32 includes a sub zone pixel electrode 421, a sub zone common electrode 422, and a compensation electrode 423, the sub zone common electrode 422 skips the scan lines 20 to electrically connect the main zone common electrode 412. The array substrate 100 defines the compensation electrode 423, which electrically connects with the sub zone pixel electrode 421 and insulates with the sub zone common electrode 422, in the sub zone 42 of each sub-pixel 40, and the projection area of the compensation electrode 423 on the base plate 10 does not overlap with the projection area of the sub zone pixel electrode 421 on the base plate 10, such the sub zone common electrode 422 and the sub zone pixel electrode 421 can generate a horizontal electric field that affects the liquid crystal molecules, therefore the storage capacitance between the sub zone pixel electrode 421 and the sub zone common electrode 422 is compensated, furthermore, the problems of flicker, interference, and ghost shadow occurred in the display panel 100, which are caused by a small storage capacitance between the sub zone pixel electrode 421 and the sub zone common electrode 422, can be avoided.

In detail, the voltage $V_{ft}$ is generated due to the capacitance coupling effect (Feedthrough effect), $$V_{ft} = \frac{c_{gs}}{(c_{st} + c_{lc} + c_{pd} + c_{gt}) * (v_{gh} - v_{gl})} \quad \text{(formula 1)}$$

($V_{ft}$ affect the charging effect of the pixel electrode, smaller value of $V_{ft}$ equates to better performance), $C_{gs}$ is the capacitance generated by the scan line 20 and the source electrode of the thin film transistor, $C_{lc}$ is the liquid crystal capacitance, Cpd is the capacitance generated between the pixel electrode and the data line, $V_{gh}$ and $V_{gl}$ are the highest voltage and the lowest voltage of the scan signal of the scan line 20 respectively. The formula 1 shows that, the larger $C_{gs}$, the higher the voltage of the capacitance coupling effect, which is not good for charging the corresponding pixel electrode.

In the exemplary embodiment, the array substrate 100 further includes a first thin film transistor 431, a second thin film transistor 432, and a third thin film transistor 433 spaced from each other and all defined on the scan line 20, gate electrodes of the first thin film transistor 431, the second thin film transistor 432, and the third thin film transistor 433 all electrically connect to the scan line 20, source electrodes of the first thin film transistor 431, the second thin film transistor 432, and the third thin film transistor 433 all electrically connect to the data line 30, the drain electrode of the first thin film transistor 431 connects to the main zone pixel electrode 411, the drain electrodes of the second thin film transistor 432, and the third thin film transistor 433 all electrically connect to the compensation electrode 423.

The sub zone pixel electrode 421 includes two drain electrodes which can be the second thin film transistor 432 and the third thin film transistor 433, while the main zone pixel electrode only has one drain electrode which is the first thin film transistor 431, therefore, the $C_{gs}$ voltage of the sub zone pixel electrode 421 is twice the $C_{gs}$ voltage of the main zone pixel electrode 411, such the $V_{ft}$ voltage of the sub zone pixel electrode 421 is also twice the $V_{ft}$ voltage of the main zone pixel electrode 411. The formula 1 shows that, the value of $C_{st}$ in the increased denominator can be used for decreasing $V_{ft}$ voltage, thus the $V_{ft}$ voltage of the main zone pixel electrode 411 may be almost the same with the $V_{ft}$ voltage of the sub zone pixel electrode 421, the difference between the best common voltages (best $V_{com}$) of the main zone pixel electrode 411 and the sub zone pixel electrode 421 is reduced, as such the flicker is reduced, and the entail display effect of the display panel 1000 is improved. Therefore, the compensation electrode 423 is increased to compensate the structure of the compensation capacitance, the $C_{st}$ of the sub zone pixel electrode 421 is increased, the $V_{ft}$ voltage of the sub zone pixel electrode 421 is decreased.

As the compensation electrode 423 has the same signal with the sub zone pixel electrode 421, which may seriously affected the liquid crystal alignment of the sub zone pixel electrode 421. In order to solve the problem, the projection area of the compensation electrode 423 on the base plate 10 is set to be not greater than the projection area of the sun zone pixel electrode 422 on the base plate 10, the projection area of the sub zone common electrode 422 on the base plate 10 at least partially overlaps with a projection area of the sub zone pixel electrode 421 on the base plate 10, the projection area of the compensation electrode 423 on the base plate 10 spaces from the projection area of the sub zone pixel electrode 421 on the base plate 10, such the signal of the sub zone common electrode 422 can be used for separating the signal of the compensation electrode 423 from the signal of the sub zone pixel electrode 421, therefore the liquid crystals can be set to rotate correctly.

The sub zone pixel electrode 421 and the main zone pixel electrode 411 can both be a translucent electrode or a reflecting electrode. When the sub zone pixel electrode 421 and the main zone pixel electrode 411 is the translucent electrode, the sub zone pixel electrode 421 and the main zone pixel electrode 411 may both include a transparent conductive layer. For example, the transparent conductive layer may include at least one selected from a group consisting of indium tin oxide (ITO), indium oxide zinc (IZO), zinc oxide (ZnO), indium oxide (In2O3), indium gallium oxide (IGO), and alumina zinc (AZO). Apart from the transparent conductive layer, the sub zone pixel electrode 421 and the main zone pixel electrode 411 may includes a translucent reflecting layer which can improve luminous efficiency. The translucent reflecting layer can be a thin layer (for example, the thin layer has a thickness of several nanometers to dozens of nanometers), and the thin layer may include at least one selected from a group consisting of Ag, Mg, Al, Pt, Pd, Au, Ni, Nd, Jr, Cr, Li, Ca, and Yb. The compensation electrode 423 and the sub zone pixel electrode 421 can be made of the same material or different materials, the present disclosure does not limit this.

For the array substrate 100 in the present disclosure, the sub zone common electrode 422, the compensation electrode 423, and the sub zone pixel electrode 421 are formed on the base plate 10 in sequence, the compensation electrode 423 insulates with the sub zone common electrode 422, and electrically connects with the sub zone pixel electrode 421 through a through hole, the projection area of the compensation electrode 423 on the base plate is not more than the projection area of the sub zone common electrode 422 on the base plate 10, the projection area of the sub zone common electrode 422 on the base plate 10 at least partially overlaps with a projection area of the sub zone pixel electrode 421 on the base plate 10, the projection area of the compensation electrode 423 on the base plate 10 spaces from the projection area of the sub zone pixel electrode 421 on the base plate 10, thus the compensation electrode 423 would not shield the sub zone common electrode 422, and the rotating of the liquid crystals would also not be affected, the alignment of liquid crystals is improved.

Referring to FIG. 1, the sub zone common electrode 422 includes a first common electrode 422a paralleled to the data lines 30 and a second common electrode 422b paralleled to the scan lines 20, the first common electrode 422a electrically connects to the second common electrode 422b, the compensation electrode 423 is defined on the second common electrode 422b, and the projection area of the compensation electrode 423 on the base plate 10 is not more than a projection area of the second common electrode 422b on the base plate 10.

In the exemplary embodiment, in the region of the sub zone 42 of each sub-pixel 40, the part of the sub zone pixel electrode 421 located in the photic area does not overlap with the compensation electrode 423 and the sub zone common electrode 422. The shading area is defined as an area defined on the array substrate 100 and covered by the black matrix, the shading area mainly includes routing of metal and components which are opaque to light, while the photic area is the other area other than the shading area. The photic area is an effective display area of the display panel. The sub zone common electrode 422 includes a first common electrode 422a paralleled to the data lines 30 and a second common electrode 422b paralleled to the scan lines 20, the first common electrode 422a, the second common electrode 422b, and the sub zone pixel electrode 421 cooperatively form a storage capacitor, the second common electrode 422b is defined at the lower edge of the sub zone pixel electrode 421, the second common electrode 422b is larger than the first common electrode 422a in area. The compensation electrode 423 is defined on the second common electrode 422b, and the compensation electrode 423 insulates with the second common electrode 422b, the projection area of the compensation electrode 423 on the base plate 10 is not greater than the projection area of the second common electrode 422b on the base plate 10, to reduce the capacitance coupling effect between the main zone and the sub zone.

Furthermore, when the width of the compensation electrode 423 gradually decreases along the extending direction of the data line 30.

The width of the first common electrode 422a gradually increases along the extending direction of the scan line 20.

Or, the width of the second common electrode 422b gradually increases along the extending direction of the data line 30 to balance the common voltages of the main zone 41 and the sub zone 42.

In the exemplary embodiment, before modified, as the projection area of the compensation electrode 423 on the base plate 10 overlaps with the projection area of the sub zone pixel electrode 421 on the base plate 10, the compensation electrode 423 would shield the electrical field of the sub zone common electrode 422, to affect the rotation of the liquid crystal, therefore, the present disclosure reduces the area of the compensation electrode 423, the electrode signal of the sub zone common electrode 422 is exposed, such the liquid crystal can rotate normally. And the reduced $C_{st}$ is compensated by increasing an overlapping area of the sub zone common electrode 422 and the sub zone pixel electrode 421.

In detail, as the projection area of the compensation electrode 423 on the base plate 10 is not greater than the projection area of the second common electrode 422b on the base plate 10, such the storage capacitance of the sub zone pixel electrode 421 decreases, in order to further decrease the $V_{fp}$, and balance the common voltage between the main zone 41 and the sub zone 42, the overlapping area of the sub zone pixel electrode 421 and the sub zone common electrode 422. There are two implementation methods, the first method is that the width of the first common electrode 422a is set to gradually increase along the extending direction of the scan line 20, that is, the overlapping area of the shield area of the sub zone pixel electrode 421 and the first common electrode 422a is increased; the second method is that the width of the second common electrode 422b is set to gradually increase along the extending direction of the data line 30, that is, the overlapping area of the shield area of the sub zone pixel electrode 421 and the second common electrode 422b, such the reduced storage capacitance of the sub zone pixel electrode 421 is compensated. In the exemplary embodiment, it is prefer to adopt the first method, as it is easier to implement the first method.

Furthermore, a change amount of an overlapping area of the compensation electrode and the sub zone common electrode is recorded as $\Delta S1$, the vertical distance between the compensation electrode and the sub zone common electrode is recorded as D1, a change amount of an overlapping area of the sub zone pixel electrode and the sub zone common electrode is recorded as $\Delta S2$, the vertical distance between the sub zone pixel electrode and the sub zone common electrode is recorded as D2, $\Delta S1/D1 = \Delta S2/D2$.

In the exemplary embodiment, before decreasing the overlapping area of the compensation electrode 423 and the sub zone common electrode 422, the capacitance between the compensation electrode 423 and the sub zone common electrode 422 can be that:

$$C1 = \frac{\varepsilon_0 \varepsilon_r S1}{D1},$$

S1 is the overlapping area of the compensation electrode 423 and the sub zone common electrode 422, D1 is the vertical distance between the compensation electrode 423 and the sub zone common electrode 422, $\varepsilon_0$ is a vacuum dielectric constant, $\varepsilon_r$ is a medium relative dielectric constant between the compensation electrode 423 and the sub zone common electrode 422, after the area of the compensation electrode 423 is reduced, the capacitance between the compensation 423 and the sub zone common electrode 422 can be $$C1' = \frac{\varepsilon_0 \varepsilon_r S1'}{D1},$$

S1' is the overlapping area of the compensation 423 and the sub zone common electrode 422 after the area of the compensation electrode 423 is reduced, the change amount of the capacitance is $\Delta C1 = C1 - C1'$, the change amount of the overlapping area of the compensation 423 and the sub zone common electrode 422 is that: $\Delta S1 = S1 - S1'$.

Before reducing the overlapping area of the compensation 423 and the sub zone common electrode 422, the capacitance between the sub zone pixel electrode 421 and the sub zone common electrode 422 can be that:

$$C2 = \frac{\varepsilon_0 \varepsilon_r' S2}{D2},$$

S2 is defined as the overlapping area of the sub zone pixel electrode 421 and the sub zone common electrode 422, D2 vertical distance between the sub zone pixel electrode 421 and the sub zone common electrode 422, $\varepsilon_0$ is a vacuum dielectric constant, $\varepsilon_r$ is a medium relative dielectric constant between the sub zone pixel electrode 421 and the sub zone common electrode 422, as the insulating material between the compensation 423 and the sub zone common electrode 422 is the same as the insulating material between the sub zone pixel electrode 421 and the sub zone common electrode 422, thus $\varepsilon_r$ is almost the same with $\varepsilon_r'$. After the area of the compensation electrode 423 is reduced and the overlapping area of the sub zone pixel electrode 421 and the sub zone common electrode 422 is increased, the capacitance between the sub zone pixel electrode 421 and the sub zone common electrode 422 can be $$C2' = \frac{\varepsilon_0 \varepsilon_r' S2'}{D2},$$

S2' is the overlapping area of the sub zone pixel electrode 421 and the sub zone common electrode 422 after the area of the sub zone common electrode 422 is increased, the change amount of the capacitance is $\Delta C2 = C2 - C2'$, the change amount of the overlapping area of the sub zone pixel electrode 421 and the sub zone common electrode 422 is that: $\Delta S2 = S2 - S2'$. As $\Delta C1 = \Delta C2$, so that $\Delta S1/D1 = \Delta S2/D2$.

Furthermore, the compensation electrode 423 and the sub zone pixel electrode 421 have the same voltage, and the sub zone common electrode 422 and the main zone common electrode 412 have the same voltage, the voltage if the main zone pixel voltage 411 is larger than the voltage of the sub zone pixel electrode 421.

In the exemplary embodiment, the compensation electrode 423 and the sub zone pixel electrode 421 have the same voltage, and the sub zone common electrode 422 and the main common electrode 412 have the same voltage, the voltage if the main zone pixel voltage 411 is larger than the voltage of the sub zone pixel electrode 421. The voltage of the main zone 41 mainly includes the voltage generated by the main zone pixel voltage 411, the voltage of the sub zone 42 mainly includes the voltages generated by the compensation electrode 423 and the sub zone pixel electrode 421. The voltage of the main zone 41 is set to be different from the voltage of the sub zone 42 to enlarge the view angle.

Referring to FIGS. 2-3, the array substrate 100 further includes a first insulating layer 50 between the sub zone common electrode 422 and the compensation electrode 423.

In the exemplary embodiment, the array substrate 100 further includes the first insulating layer 50 between the sub zone common electrode 422 and the compensation electrode 423, the first insulating layer 50 is configured to insulate with the sub zone common electrode 422 and the compensation electrode 423, the first insulating layer 50 can be a gate insulating layer.

Referring to FIGS. 2-3, the array substrate 100 further includes a second insulating layer 60 defined between the compensation electrode 423 and the sub zone pixel electrode 421, the first insulating layer 50 stacks with the second insulating layer 60.

In the exemplary embodiment, the array substrate 100 further includes the second insulating layer 60 defined between the compensation electrode 423 and the sub zone pixel electrode 421, the first insulating layer 50 stacks with the second insulating layer 60, the second insulating layer 60 is configured to make the compensation electrode 423 to insulate with the sub zone pixel electrode 421, and the compensation electrode 423 is electrically connected with the sub zone pixel electrode 421 through the through hole, the second insulating layer 70 is an insulating layer made of polyvinyl chloride. The insulating layer made of polyvinyl chloride has the properties of anti-violent ability, low temperature flexible, thicker, and flame resistance.

The present disclosure also provides a display panel 1000, the display panel 1000 includes an array substrate. The detail structure of the array substrate 1000 can be referred to the foregoing exemplary embodiments. As the display panel 1000 adopts all the technical proposals of the above exemplary embodiments, the display panel at least has all of the beneficial effects of the technical proposals of the above exemplary embodiments, no need to repeat again.

A display panel 1000 includes an array substrate 100, a color film substrate 200 facing the array substrate 100, and a liquid crystal layer 300 located between the array substrate 100 and the color film substrate 200. The liquid crystal layer 300 can adopt positive liquid crystals, such as, MJ121791. The liquid crystal layer 300 can also adopt negative liquid crystals, such as, MJ131496.

The present disclosure also provides a display device, the display device includes a display panel 1000. The detail structure of the display panel 1000 can be referred to the foregoing exemplary embodiments. As the display device adopts all the technical proposals of the above exemplary embodiments, the display device at least has all of the beneficial effects of the technical proposals of the above exemplary embodiments, no need to repeat again.

The foregoing description merely depicts some embodiments of the present application and therefore is not intended to limit the scope of the application. An equivalent structural or flow changes made by using the content of the specification and drawings of the present application, or any direct or indirect applications of the disclosure on any other related fields shall all fall in the scope of the application.

What is claimed is:

1. An array substrate, wherein, the array substrate comprises:
    a base plate, a plurality of scan lines and a plurality of data lines all formed on the base plate, the plurality of scan lines insulate and cross with the plurality of data lines to define a plurality of sub-pixels;
    each of the sub-pixels comprises a main zone and a sub zone, the scan lines are defined between the main zone and the sub zone, the main zone comprises a main zone pixel electrode and a main zone common electrode, the sub zone comprises a sub zone pixel electrode, a sub zone common electrode, and a compensation electrode, the sub zone common electrode skips the scan lines to electrically connect the main zone common electrode; and
    the sub zone common electrode, the compensation electrode, and the sub zone pixel electrode are formed on the base plate in sequence, the compensation electrode insulates with the sub zone common electrode, and electrically connects with the sub zone pixel electrode through a through hole, a projection area of the compensation electrode on the base plate is not larger than a projection area of the sub zone common electrode on the base plate, the projection area of the sub zone common electrode on the base plate at least partially overlaps with a projection area of the sub zone pixel electrode on the base plate, the projection area of the compensation electrode on the base plate is spaced from the projection area of the sub zone pixel electrode on the base plate.

2. The array substrate according to claim 1, wherein, the sub zone common electrode comprises a first common electrode parallel to the data lines and a second common electrode parallel to the scan lines, the first common electrode electrically connects to the second common electrode, the compensation electrode is defined on the second common electrode, and the projection area of the compensation electrode on the base plate is not larger than a projection area of the second common electrode on the base plate.

3. The array substrate according to claim 2, wherein, when the width of the compensation electrode along an extending direction of the data line gradually decreases,
    the width of the first common electrode along an extending direction of the scan line increases; or
    the width of the second common electrode along the extending direction of the data line increases, to balance common voltages of the main zone and the sub zone.

4. The array substrate according to claim 1, wherein, a change amount of an overlapping area of the compensation electrode and the sub zone common electrode is recorded as ΔS1, the vertical distance between the compensation electrode and the sub zone common electrode is recorded as D1, a change amount of an overlapping area of the sub zone pixel electrode and the sub zone common electrode is recorded as ΔS2, the vertical distance between the sub zone pixel electrode and the sub zone common electrode is recorded as D2, ΔS1/D1=ΔS2/D2.

5. The array substrate according to claim 1, wherein, the compensation electrode and the sub zone pixel electrode have the same voltage, the sub zone common electrode and the main zone common electrode have the same voltage, and the voltage of the main zone pixel electrode is greater than the voltage of the sub zone pixel electrode.

6. The array substrate according to claim 1, wherein, the array substrate further comprises a first thin film transistor, a second thin film transistor, and a third thin film transistor spaced from each other and all defined on the scan line, gate electrodes of the first thin film transistor, the second thin film transistor, and the third thin film transistor all electrically connect to the scan line, source electrodes of the first thin film transistor, the second thin film transistor, and the third thin film transistor all electrically connect to the data line, drain electrodes of the first thin film transistor electrically connect to the main zone pixel electrode, drain electrodes of the second thin film transistor and the third thin film transistor all electrically connect to the compensation electrode.

7. The array substrate according to claim 1, wherein, the array substrate further comprises a first insulating layer defined between the sub zone common electrode and the compensation electrode.

8. The array substrate according to claim 7, wherein, the array substrate further comprises a second insulating layer defined between the compensation electrode and the sub zone pixel electrode, the first insulating layer stacks with the second insulating layer.

9. A display panel, wherein, the display panel comprises an array substrate, a color film substrate facing the array substrate, and a liquid crystal layer located between the array substrate and the color film substrate, the array substrate comprises:
   a base plate, a plurality of scan lines and a plurality of data lines all formed on the base plate, the plurality of scan lines insulate and cross with the plurality of data lines to define a plurality of sub-pixels;
   each of the sub-pixels comprises a main zone and a sub zone, the scan lines are defined between the main zone and the sub zone, the main zone comprises a main zone pixel electrode and a main zone common electrode, the sub zone comprises a sub zone pixel electrode, a sub zone common electrode, and a compensation electrode, the sub zone common electrode skips the scan lines to electrically connect the main zone common electrode; and
   the sub zone common electrode, the compensation electrode, and the sub zone pixel electrode are formed on the base plate in sequence, the compensation electrode insulates with the sub zone common electrode, and electrically connects with the sub zone pixel electrode through a through hole, a projection area of the compensation electrode on the base plate is not larger than a projection area of the sub zone common electrode on the base plate, the projection area of the sub zone common electrode on the base plate at least partially overlaps with a projection area of the sub zone pixel electrode on the base plate, the projection area of the compensation electrode on the base plate is spaced from the projection area of the sub zone pixel electrode on the base plate.

10. The display panel according to claim 9, wherein, the sub zone common electrode comprises a first common electrode parallel to the data lines and a second common electrode parallel to the scan lines, the first common electrode electrically connects to the second common electrode, the compensation electrode is defined on the second common electrode, and the projection area of the compensation electrode on the base plate is not larger than a projection area of the second common electrode on the base plate.

11. The display panel according to claim 10, wherein, when the width of the compensation electrode along an extending direction of the data line gradually decreases, the width of the first common electrode along an extending direction of the scan line increases; or the width of the second common electrode along the extending direction of the data line increases, to balance common voltages of the main zone and the sub zone.

12. The display panel according to claim 9, wherein, a change amount of an overlapping area of the compensation electrode and the sub zone common electrode is recorded as ΔS1, the vertical distance between the compensation electrode and the sub zone common electrode is recorded as D1, a change amount of an overlapping area of the sub zone pixel electrode and the sub zone common electrode is recorded as ΔS2, the vertical distance between the sub zone pixel electrode and the sub zone common electrode is recorded as D2, ΔS1/D1=ΔS2/D2.

13. The display panel according to claim 9, wherein, the compensation electrode and the sub zone pixel electrode have the same voltage, the sub zone common electrode and the main zone common electrode have the same voltage, and the voltage of the main zone pixel electrode is greater than the voltage of the sub zone pixel electrode.

14. The display panel according to claim 9, wherein, the array substrate further comprises a first thin film transistor, a second thin film transistor, and a third thin film transistor spaced from each other and all defined on the scan line, gate electrodes of the first thin film transistor, the second thin film transistor, and the third thin film transistor all electrically connect to the scan line, source electrodes of the first thin film transistor, the second thin film transistor, and the third thin film transistor all electrically connect to the data line, drain electrodes of the first thin film transistor electrically connect to the main zone pixel electrode, drain electrodes of the second thin film transistor and the third thin film transistor all electrically connect to the compensation electrode.

15. The display panel according to claim 9, wherein, the array substrate further comprises a first insulating layer defined between the sub zone common electrode and the compensation electrode.

16. The display panel according to claim 15, wherein, the array substrate further comprises a second insulating layer defined between the compensation electrode and the sub zone pixel electrode, the first insulating layer stacks with the second insulating layer.

17. A display device, wherein, the display device comprises a display panel, the display panel comprises an array substrate, a color film substrate facing the array substrate, and a liquid crystal layer located between the array substrate and the color film substrate, the array substrate comprises:
   a base plate, a plurality of scan lines and a plurality of data lines all formed on the base plate, the plurality of scan lines insulate and cross with the plurality of data lines to define a plurality of sub-pixels;
   each of the sub-pixels comprises a main zone and a sub zone, the scan lines are defined between the main zone and the sub zone, the main zone comprises a main zone pixel electrode and a main zone common electrode, the sub zone comprises a sub zone pixel electrode, a sub zone common electrode, and a compensation electrode, the sub zone common electrode skips the scan lines to electrically connect the main zone common electrode; and
   the sub zone common electrode, the compensation electrode, and the sub zone pixel electrode are formed on the base plate in sequence, the compensation electrode insulates with the sub zone common electrode, and electrically connects with the sub zone pixel electrode through a through hole, a projection area of the compensation electrode on the base plate is not larger than a projection area of the sub zone common electrode on the base plate, the projection area of the sub zone common electrode on the base plate at least partially overlaps with a projection area of the sub zone pixel electrode on the base plate, the projection area of the compensation electrode on the base plate is spaced from the projection area of the sub zone pixel electrode on the base plate.

\* \* \* \* \*